(12) United States Patent
Wu et al.

(10) Patent No.: US 7,851,358 B2
(45) Date of Patent: Dec. 14, 2010

(54) LOW TEMPERATURE METHOD FOR MINIMIZING COPPER HILLOCK DEFECTS

(75) Inventors: Jun Wu, Taoyuan County (TW); Wen-Long Lee, Taipei (TW); Chyi-Tsong Ni, Hsin-Chu (TW); Shih-Chi Lin, Shin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 711 days.

(21) Appl. No.: 11/122,393

(22) Filed: May 5, 2005

(65) Prior Publication Data

US 2006/0252258 A1    Nov. 9, 2006

(51) Int. Cl.
*H01L 21/44* (2006.01)

(52) U.S. Cl. ............... 438/660; 438/663; 438/687; 257/E21.294; 257/E21.3; 257/E23.161

(58) Field of Classification Search ............ 438/660, 438/672, 687, 663
See application file for complete search history.

(56) References Cited

U.S. PATENT DOCUMENTS

| | | | |
|---|---|---|---|
| 6,248,665 B1 | 6/2001 | Bao et al. | |
| 6,348,410 B1 | 2/2002 | Ngo et al. | |
| 6,368,948 B1 * | 4/2002 | Ngo et al. | 438/584 |
| 6,391,754 B1 | 5/2002 | Paranjpe | |
| 6,391,777 B1 | 5/2002 | Chen et al. | |
| 6,500,754 B1 | 12/2002 | Erb et al. | |
| 6,515,373 B2 | 2/2003 | Barth | |
| 6,518,183 B1 * | 2/2003 | Chang et al. | 438/687 |
| 6,562,712 B2 * | 5/2003 | Liu et al. | 438/631 |
| 6,670,274 B1 | 12/2003 | Liu et al. | |
| 6,713,407 B1 * | 3/2004 | Cheng et al. | 438/775 |
| 6,734,101 B1 | 5/2004 | Bao et al. | |
| 6,806,184 B2 | 10/2004 | Chen et al. | |
| 6,943,451 B2 * | 9/2005 | Whitehair et al. | 257/774 |
| 7,074,721 B2 * | 7/2006 | Wang | 438/706 |
| 2004/0003873 A1 * | 1/2004 | Chen et al. | 148/518 |
| 2004/0067643 A1 | 4/2004 | Liu et al. | |
| 2004/0087147 A1 | 5/2004 | Lavric et al. | |
| 2004/0092100 A1 | 5/2004 | Cheng et al. | |
| 2004/0110373 A1 | 6/2004 | Liu et al. | |
| 2004/0198055 A1 | 10/2004 | Wang | |

OTHER PUBLICATIONS

Taiwan Office Action dated May 15, 2008 for TW Patent Application No. 095115875 filed May 4, 2006. TW.

* cited by examiner

*Primary Examiner*—Hsien-ming Lee
(74) *Attorney, Agent, or Firm*—Duane Morris LLP

(57) ABSTRACT

A method of fabricating a copper interconnect on a substrate is disclosed in which the interconnect and substrate are subjected to a low temperature anneal subsequent to polarization of the interconnect and prior to deposition of an overlying dielectric layer. The low temperature anneal inhibits the formation of hillocks in the copper material during subsequent high temperature deposition of the dielectric layer. Hillocks can protrude through passivation layer, thus causing shorts within the connections of the semiconductor devices formed on the substrate. In one example, the interconnect and substrate are annealed at a temperature of about 200° C. for a period of about 180 seconds in a forming gas environment comprising hydrogen (5 parts per hundred) and nitrogen (95 parts per hundred).

20 Claims, 5 Drawing Sheets

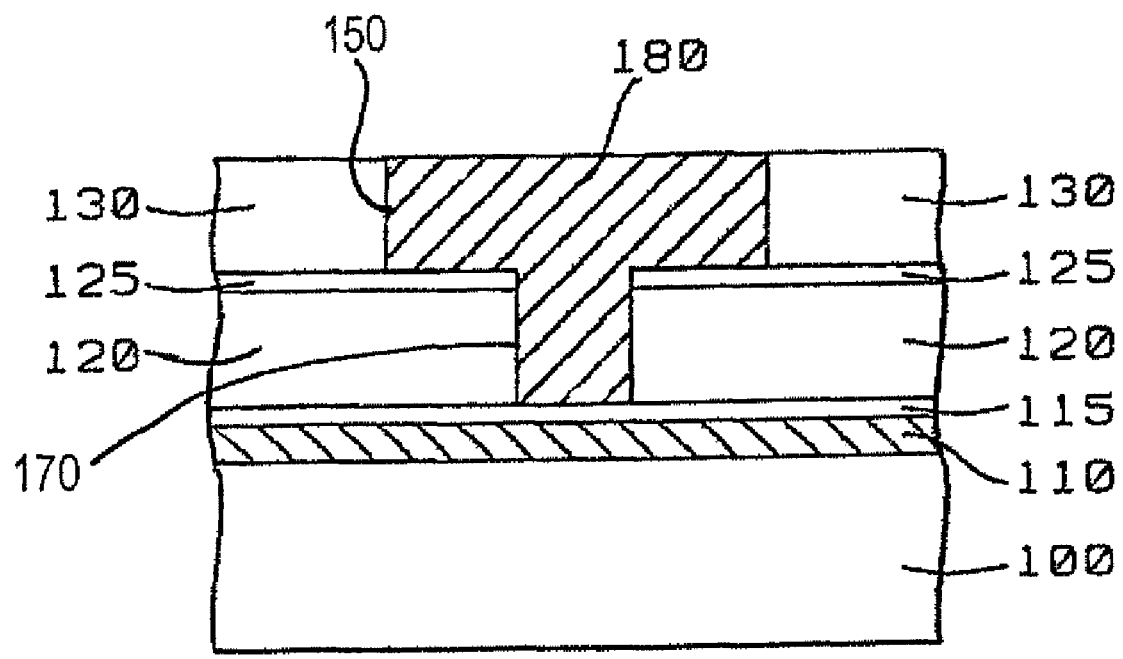
FIG. 1a – Prior Art

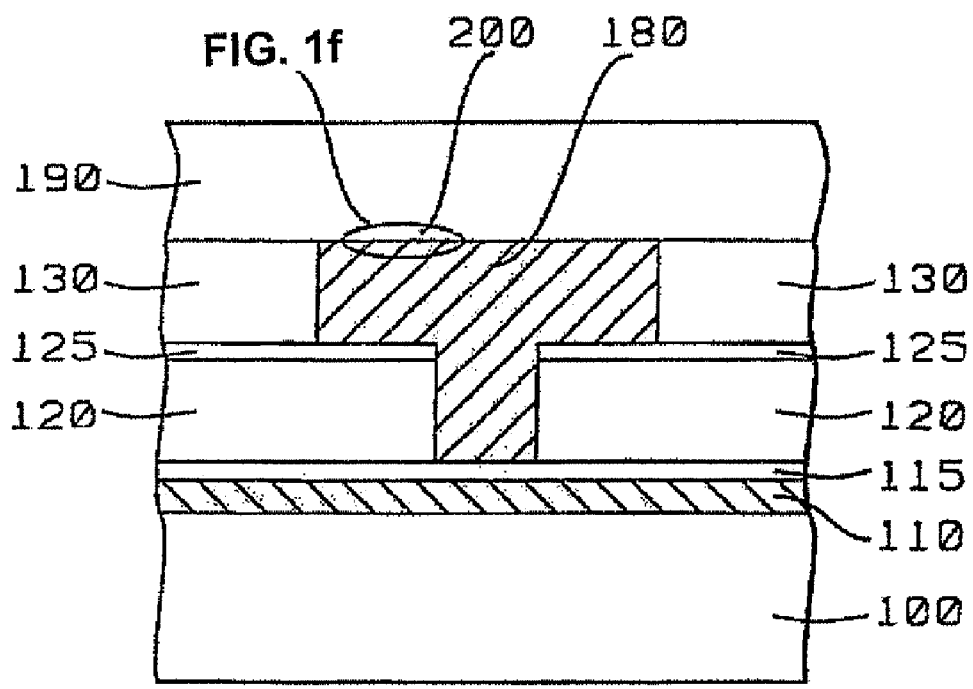
FIG. 1b – Prior Art
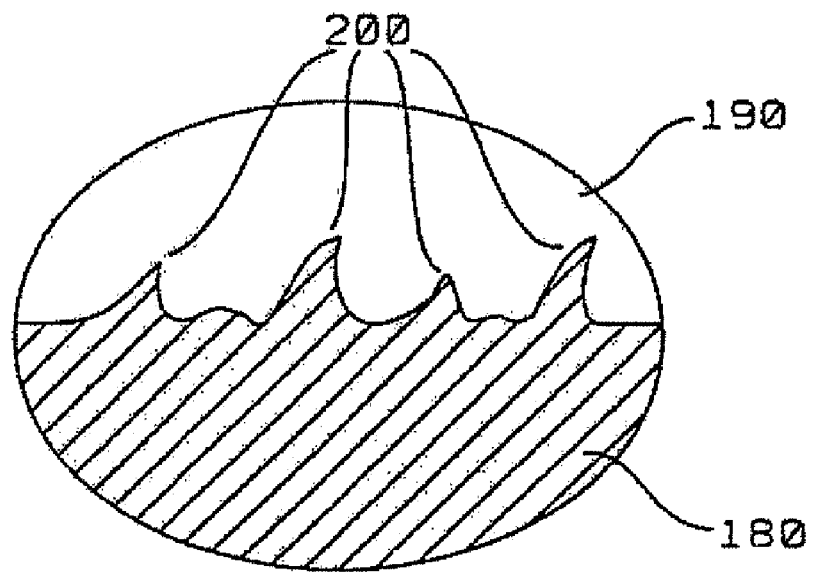
FIG. 1c – Prior Art

LOW TEMPERATURE METHOD FOR MINIMIZING COPPER HILLOCK DEFECTS

FIELD OF THE INVENTION

The present invention relates to a method for fabricating integrated circuit devices.

BACKGROUND OF THE INVENTION

Copper is preferred in forming metal interconnects in ultra-large scale integrated ULSI semiconductor devices. This is because, as semiconductor device geometries continue to scale down below 0.25 μm, and approach 0.13 μm feature sizes, the metal interconnect lines which carry current between devices on a chip begin to dominate the overall circuit speed. In order to enhance interconnect speed and reliability, the semiconductor industry is moving away from blanket deposition and etch of aluminum (Al) based metallization towards single-damascene and dual-damascene interconnect structures with copper (Cu) based metallizations.

Copper is a lower resistivity metal than aluminum, which results in lower RC interconnect delay. Copper has also been shown to have superior electromigration characteristics over aluminum, but is more difficult to process, primarily because it is more difficult to etch, and it acts as a deep level trap in silicon (Si) based devices. The preferred way to process copper interconnects is to etch a line trench, via hole, or a contact hole into a dielectric material, deposit the interconnect metallization to fill the trench or hole, and then polish the metal back to remove any metal from the surface of the substrate or wafer. The resulting metal-filled trenches and holes form the electrical interconnect. Forming an interconnect structure by filling a trench or hole with metal is known as a damascene process. If a trench an underlying via hole are filled simultaneously, it is known as a dual-damascene process.

The process of forming conventional single or dual-damascene structures is shown in FIGS. 1a-1c. In one approach, two insulator layers 120 and 130 are formed on a substrate 100 with an intervening etch-stop layer 125. Substrate 100 is provided with metal layer 110 and a barrier layer 115. Using conventional photolithographic methods and photoresist, the upper and lower insulator layers 120, 130 are etched using a known dual-damascene technique in which successive photoresist patterning is used to create corresponding hole patterns in the layers. After the completion of the thusly formed dual damascene structure, both the via opening 170 and trench opening 150 are filled with metal 180, and any excess material on the surface of the substrate is removed by chemical mechanical polishing (CMP) to produce the structure shown in FIG. 1a. The process can be repeated as many times as required to form the multi-level interconnections between metal lines and the holes formed therebetween that are common in modern semiconductor devices.

Although copper has desirable functional properties that make its use advantageous for forming interconnect and via structures, some reliability issues remain. For example, copper interconnects can suffer from the problem of hillock formation due to stresses resulting from the various high temperature process steps required to form semiconductor devices. Hillocks are spike-like projections that can erupt in response to compressive stresses generated in metal films due to differences in thermal expansion coefficients between adjacent materials in the semiconductor structure. These compressive stresses can cause hillocks to form and consequently protrude from the copper surface, as shown in FIG. 1c. If the hillocks are sufficiently large, they can protrude through any overlying dielectric or other layers and cause short circuiting between metal layers.

It is believed that two major factors affect the formation of hillocks: (1) non-uniform Cu oxide formation on the surface of the copper structure, and (2) high temperatures associated with subsequent chemical vapor deposition (CVD).

Non-uniform Cu native oxide is formed when the Cu film is exposed to the manufacturing atmosphere subsequent to polarization (CMP). Since the oxide formation process is uncontrolled, the oxide layer is typically uneven, and as such it can cause unbalanced expansion of Cu grains when the structure is subjected to high temperatures (e.g. during subsequent CVD). The resulting difference in expansion rates across the uneven copper oxide layer can induces hillocks.

A typical high-temperature process step that can trigger hillock formation is the deposition of an intermetal dielectric (IMD) layer 190 over the structure after the dual damascene interconnect such as 180 in FIG. 1c has been formed. Dielectric layers can be deposited using any of a variety of techniques, such as CVD, and the process is typically carried out at a temperature of at or above 300° Celsius (C). Because of the aforementioned difference in the thermal expansion coefficients, metals such as copper want to expand more than allowed by the substrate, the dielectric, or even oxides on the copper surface. The metal, however, is prevented from doing so, assuming the adhesion between the layers is adequate. As a result, compressive stresses build in the metal film. If these stresses become too large (i.e., where the process temperature exceeds 300° C.), the stresses are relieved by the growth of hillocks at the film surface, as referenced by numeral 200 in FIGS. 1b and 1c.

To ameliorate the formation of hillocks during the CVD process, current techniques utilize a high temperature annealing step just prior to CVD of the insulating layer. Thus, after the via and trench openings 150, 170 are filled with metal, and CMP has been performed to remove excess Cu material from the top of the semiconductor structure, an annealing step is carried out at a temperature of about 400° C. and is held for about 20 seconds. This annealing step is intended to relax the internal grain structure of the Cu, and to release internal stresses in the Cu generated during Cu plating and the CMP processes.

As noted, these protruding hillocks can adversely affect the ability of overlying dielectric layers to adequately passivate the top surface of the underlying copper structure. If hillocks are large enough, they can protrude through the dielectric layer and result in short-circuit types of defects either immediately or over time, which irrevocably damage the integrated circuit. Thus, it would be advantageous to provide a method for reducing or eliminating such hillocks.

SUMMARY OF THE INVENTION

These and other features and advantages of the present invention will be more fully disclosed in, or rendered obvious by, the following detailed description. A method is disclosed comprising the steps of: (a) depositing a copper layer on a substrate; (b) planarizing the copper layer; (c) annealing the copper layer; and (d) applying a dielectric layer over the copper layer; wherein the annealing step inhibits the formation of hillocks in the copper layer during the step of applying the dielectric layer.

A method is also disclosed comprising the steps of: (a) depositing a copper layer on a substrate; (b) planarizing the copper layer; (c) annealing the copper layer while exposing the copper layer to a reductive gas environment comprising hydrogen; and (d) applying a dielectric layer over the copper layer using CVD; wherein the annealing step substantially removes copper oxides from the surface of the copper layer, thereby preventing formation of surface discontinuities in the copper layer during the step of applying the dielectric layer.

BRIEF DESCRIPTION OF THE DRAWINGS

These and other features and advantages of the present invention will be more fully disclosed in, or rendered obvious by, the following detailed description of the preferred embodiment of the invention, which is to be considered together with the accompanying drawings wherein like numbers refer to like parts, and further wherein:

FIGS. 1a-c show the prior art process of forming a copper semiconductor structure in which copper hillocks are formed;

DETAILED DESCRIPTION

According to an embodiment of the present invention, disclosed herein is a low temperature process for inhibiting the formation of hillocks in copper semiconductor structures when the structures are exposed to the temperatures involved in semiconductor processing.

Figure 2:
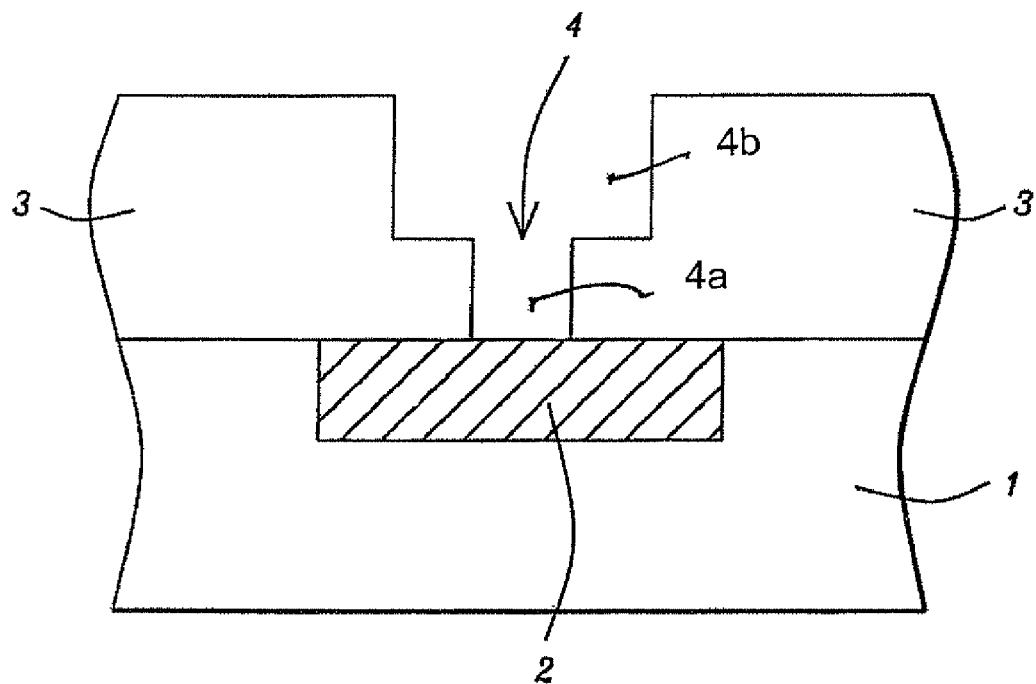
FIG. 2 is a cross-section view of a structure having a conductive layer disposed between a substrate and an insulator layer, and further having an opening formed in the insulator layer exposing the conductive layer.
Figure 3:
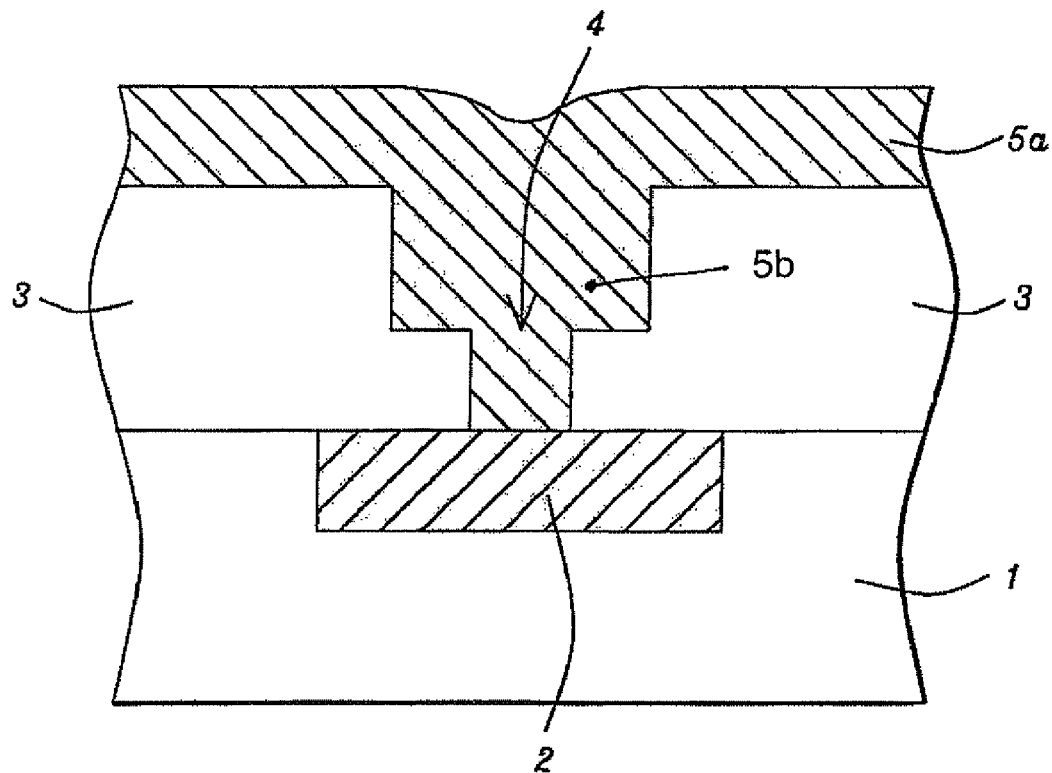
FIG. 3 is a cross-section view of the structure of FIG. 1 in which a copper layer is disposed in the trench and via opening.
Figure 4:
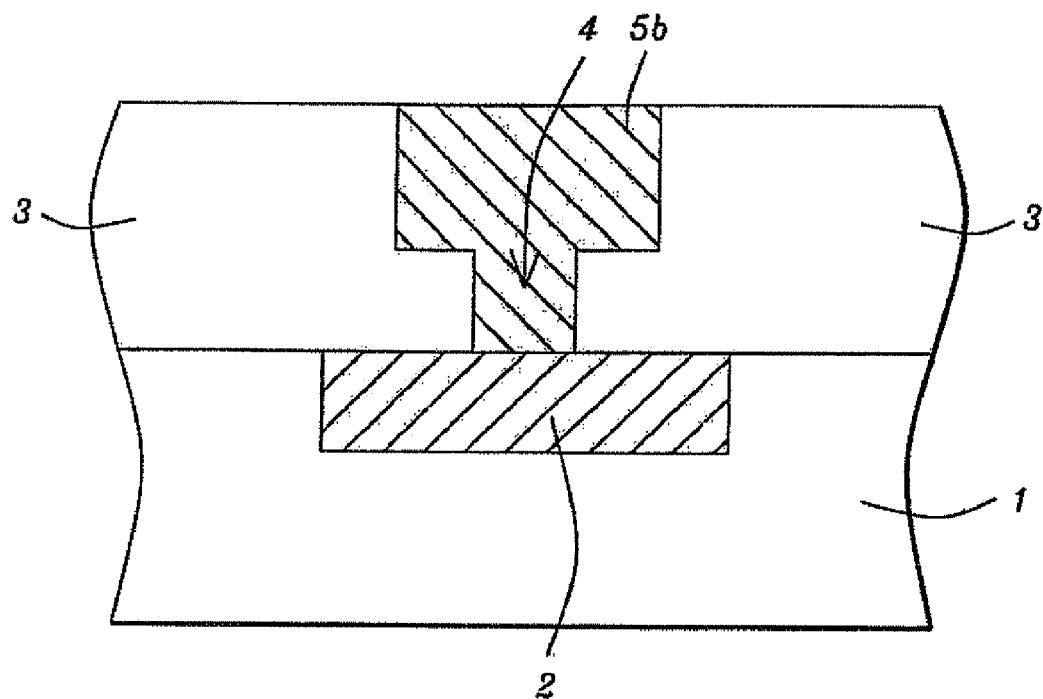
FIG. 4 is a cross-section view of the structure of FIG. 2 in which the copper layer has been planarized to expose an upper surface of the insulator layer.

As shown in FIG. 2, a substrate 1 is provided with a conductive layer 2, and an upper insulating layer 3. Substrate 1 can be any appropriate semiconductor substrate such as monocrystalline silicon, or alternatively it could be an insulator such as silicon dioxide, borosilicate glass (BSG), borophosphosilicate glass (BPSG) or the like. Conductive layer 2 can be copper, aluminum or tungsten, while upper insulating layer 3 can be any suitable passivation material as are known in the art, such as silicon dioxide, BSG, BPSG, etc. Upper insulating layer 3 can be deposited using a technique such as CVD.

An opening 4 is then formed in the upper insulating layer 3 using, for example, a dual damascene technique using reactive ion etching (RIE) with $CHF_3$ as an etchant, although any suitable dry or wet etching technique known in the art may be used to form the desired opening. In the illustrated embodiment (FIG. 2) the opening 4 is a via 4a and trench 4b, but a single shaped opening also could be provided. It is noted that for purposes of clarity, FIGS. 2-6 do not specifically show any of the typical intervening layers found in semiconductor structures like the one illustrated (e.g. titanium nitride barrier layer, copper seed layer, etc.). One of ordinary skill in the art will recognize that such layers can be present, and that their presence or absence is not critical to the disclosed annealing process.

After the opening 4 is formed, a copper layer 5a is plated or otherwise deposited onto the upper insulating layer 3, filling the opening 4 and blanketing the upper surface of the insulation layer 3. The copper layer 5a is then planarized using any appropriate technique, such as CMP, so that the copper layer is removed from the top surface of the upper insulating layer 3 but remains within the opening 4, forming a copper interconnect structure 5b.

Figure 5:
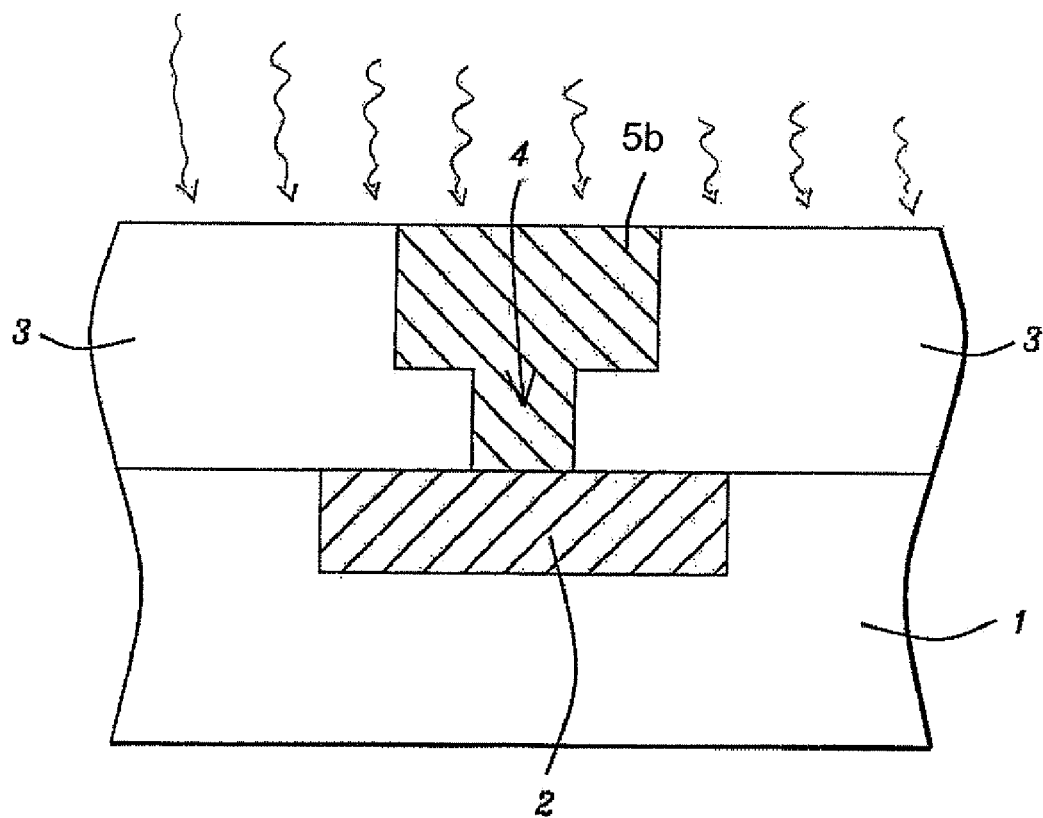
FIG. 5 is a cross-section view of the structure of FIG. 4 showing the annealing step.

As illustrated in FIG. 5, the structure is then subjected to a low temperature annealing process in a reducing or forming gas atmosphere. The inventors have found that this low temperature annealing will not result in hillock formation, and the use of a reducing or forming gas atmosphere removes native copper oxides from the top surface of the copper interconnect structure 5b. As compared to an un-annealed copper surface, copper interconnect 5b has a substantially oxide-free surface that will be more resistant to copper hillock formation during subsequent heat excursions during deposition of overlying passivation layer 6. In one example, the structure is annealed at a temperature in the range of from about 200° C. to about 300° C. In another example, the structure is annealed at a temperature is in the range of from about 220° C. to about 240° C. In yet another example, the structure is annealed at a temperature of about 240° C.

The inventors have found that annealing the copper film at temperatures greater than 300° C. increases hillock formation, while annealing at temperatures less than 200° C. results in non-uniform reduction of copper oxide on the copper film surface, which likewise results in aggravated hillock formation.

The annealing temperature should be held substantially within the selected temperature range for a period of from about 150 seconds to about 250 seconds. In one preferred embodiment, the time period is about 180 seconds. This hold time is important to ensure sufficient reduction in the native oxide film from the top surface of the copper material, and to ensure adequate relaxation of the copper grain structure. Greater hold times would unnecessarily extend the wafer processing sequence, and could also aggravate hillock formation.

Furthermore, the reducing or forming gas atmosphere preferably is a hydrogen ($H_2$) gas atmosphere diluted with nitrogen ($N_2$) gas. This gas atmosphere can act to remove native oxides on the Cu film surface through a reduction reaction between the $H_2$ and the Copper oxides. This reduction may be represented by the equation $CuO + H_2 \rightarrow Cu + H_2O$. In one example, the reducing or forming gas atmosphere comprises about 5 parts per hundred of $H_2$ gas and about 95 parts per hundred of $N_2$ gas (i.e. a 1/20 ratio of reducing to forming gas). Alternatively, a ratio of reducing to forming gas of from about 1/10 to about 1/25 could be used. Regardless of the ratio, it is important that a sufficient quantity of reductive gas be provided throughout the annealing step, in order to remove native oxides, since it is believed that non-uniform native copper oxide formation on the copper surface would hinder the "relaxation" of the copper grains and would thus aggravate hillock formation.

Subsequent to the annealing, the structure can be transferred to a cooling station (at room temperature) and subjected to a flow of $N_2$ gas for about 120 seconds, or until the structure reaches room temperature.

Thus the disclosed procedure allows for shorter annealing times as compared to present methods, and also requires less input energy since the annealing temperature is lower than present methods. Even with the reduction in annealing time and temperature, hillock formation is significantly reduced as compared to methods of device formation in which no pre-CVD annealing procedure is employed. Thus, the disclosed method provides for more efficient device processing compared to prior methods, which can lead to a reduction in overall processing costs.

Figure 6:
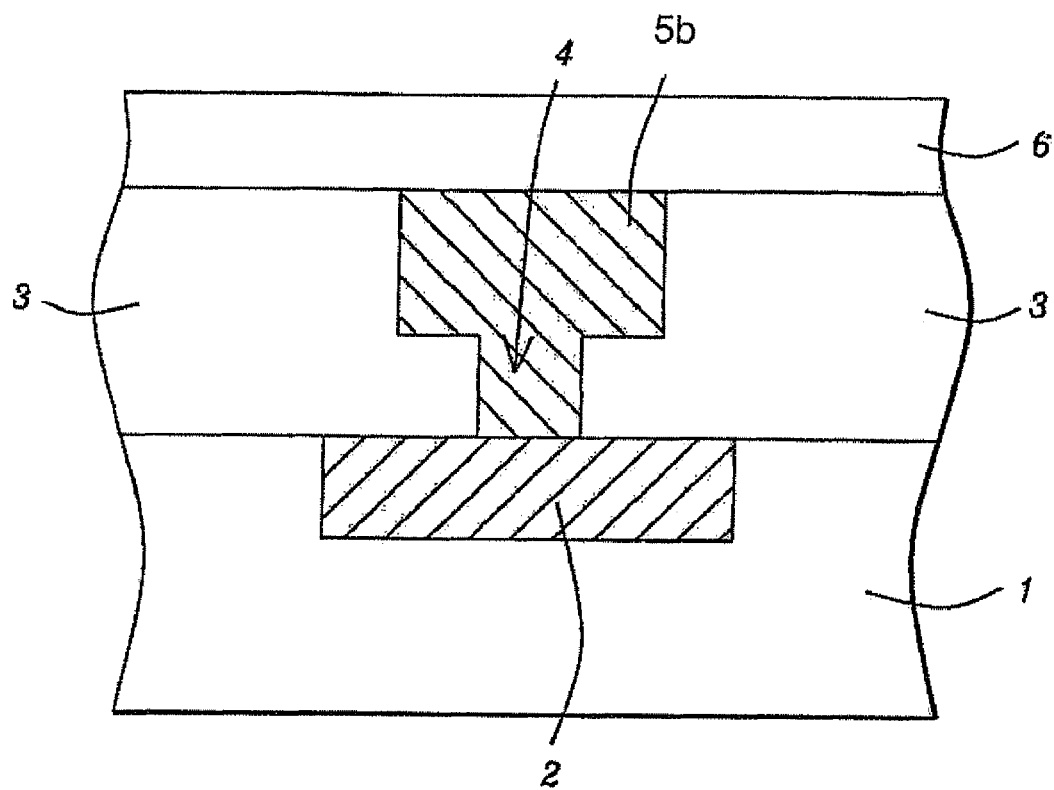
FIG. 6 is a cross-section view of the structure of FIG. 5 in which a dielectric layer has been deposited on top of the copper layer.

FIG. 6 shows a passivating dielectric layer 6 formed over the copper plug 5b and upper insulating layer 3. Dielectric layer 6 can be any suitable passivation material as are known in the art, such as silicon nitride, silicon dioxide, or the like. Typically this layer is formed to a thickness of from about 200 to about 800 angstroms using known CMV techniques or plasma enhanced CVD (PECVD). These deposition processes can subject the copper plug 5b to temperatures above about 300° C. Since the copper plug 5b has been subjected to the previously described low temperature annealing process, the subsequent application of high temperatures will not result in significant compressive stresses in the copper due to an uneven copper oxide layer, and thus the likelihood for stress-induced hillocks to form is minimized.

It is believed that the combination of the temperature and the reducing or forming gas atmosphere inhibits the formation of copper oxide (CuO) on the upper surface of the copper film 5b. Since copper oxide film formation is a contributor to subsequent hillock formation, reducing or eliminating the copper oxide film will reduce the formation of hillocks during subsequent processing. This low-temperature annealing eliminates the need for performing the current high-temperature annealing step that is performed prior to subsequent dielectric CVD.

Although copper oxides will reform on the copper surface once it is removed from the reducing atmosphere, it would be preferable to maintain the copper surface in the reducing atmosphere between the annealing and CVD steps. However, this is not required, and the inventors have found that simply minimizing the time between the annealing step and the subsequent CVD step is sufficient to substantially reduce hillock formation during the CVD step, even where a slight oxide layer is formed subsequent to annealing. This is believed to be due to the substantial relaxation of the Cu grains achieved by the low temperature annealing process.

Table 1 represents hillock counts measured on copper test samples, where the copper samples were subjected to a pre-CVD annealing process under a 95/5 $N_2/H_2$ blanket for a period of about 180 seconds. As can be seen from the representative data in Table 1, low temperature annealing of copper samples at between 200° C. and 260° C. resulted in significantly reduced hillock counts, as compared to annealing temperatures of greater than 300° C. and 180° C. less. For the purposes of this test, hillocks were measured using an AIT inspection system manufactured by KLA Tencor, which is capable of scanning and measuring defects on a wafer/film surface. "Saturated" means that the results of the AIT scan were so high as to be beyond the limit that the AIT tool

TABLE 1

| Sample | Anneal Temp (° C.) | Post CMP Hillock Count | Post-CVD Hillock Count |
|---|---|---|---|
| 1 | No Anneal | 159 | 1538 |
| 2 | No Anneal | 168 | 1920 |
| 3 | 25 | 142 | 3218 |
| 4 | 25 | 157 | 2859 |
| 5 | 150 | 139 | Saturated |
| 6 | 150 | 149 | Saturated |
| 7 | 180 | 162 | 1024 |
| 8 | 180 | 173 | 863 |
| 9 | 200 | 165 | 53 |
| 10 | 200 | 153 | 61 |
| 11 | 220 | 159 | 22 |
| 12 | 220 | 149 | 31 |
| 13 | 260 | 173 | 54 |
| 14 | 260 | 154 | 68 |
| 15 | 300 | 137 | 258 |
| 16 | 300 | 148 | 314 |

TABLE 1-continued

| Sample | Anneal Temp (° C.) | Post CMP Hillock Count | Post-CVD Hillock Count |
|---|---|---|---|
| 17 | 350 | 169 | 2012 |
| 18 | 350 | 129 | 1972 |
| 19 | 400 | 148 | 1483 |
| 20 | 400 | 171 | 1732 |

While the foregoing invention has been described with reference to the above embodiments, various modifications and changes can be made without departing from the spirit of the invention. Accordingly, all such modifications and changes are considered to be within the scope and range of equivalents of the appended claims.

What is claimed is:

1. A method comprising the steps of:
   depositing a copper layer on a substrate,
   planarizing the copper layer;
   annealing the planarized copper layer while exposing the planarized copper layer to a forming gas environment comprising hydrogen;
   subjecting the annealed and planarized copper layer to a flow of nitrogen gas until the annealed and planarized copper layer reaches room temperature; and
   applying a dielectric layer over the annealed and planarized copper layer;
   wherein the annealing step comprises exposing the planarized copper layer to a temperature of between about 200° C. to about 260° C.; and
   wherein the forming gas environment comprising hydrogen is maintained during the annealing step and the step of applying the dielectric layer.

2. The method of claim 1, wherein the step of depositing the copper layer is performed by electroplating.

3. The method of claim 1, wherein the step of planarizing the copper layer is performed using CMP techniques.

4. The method of claim 1, wherein the step of annealing the planarized copper layer is performed at an annealing temperature of between about 220° C. to about 260° C.

5. The method of claim 4, wherein the step of annealing the planarized copper layer further comprises holding the annealing temperature substantially constant for a duration of about 150 seconds to about 200 seconds.

6. The method of claim 4, wherein the step of annealing the planarized copper layer further comprises holding the annealing temperature substantially constant for a duration of about 180 seconds.

7. The method of claim 1, wherein the step of annealing the planarized copper layer is performed at an annealing temperature of about 200° C., and the annealing temperature is held substantially constant for at least about 180 seconds.

8. The method of claim 1, wherein the forming gas environment comprising hydrogen further comprises nitrogen, and wherein the volume ratio of nitrogen gas to hydrogen gas is about 1/10 to about 1/25.

9. The method of claim 1, wherein the forming gas environment comprising hydrogen comprises a quantity of hydrogen gas sufficient to substantially reduce copper oxides on a surface of the planarized copper layer during the annealing step.

10. The method of claim 9, wherein the hydrogen gas is diluted with nitrogen gas.

11. The method of claim 10, wherein the forming gas environment comprising hydrogen comprises approximately 5% by volume of hydrogen and approximately 95% by volume of nitrogen.

12. The method of claim 1, wherein the step of applying a dielectric layer comprises depositing the dielectric using CVD.

13. A method comprising the steps of:
depositing a copper layer on a substrate,
planarizing the copper layer;
annealing the planarized copper layer while exposing the planarized copper layer to a forming gas environment comprising hydrogen;
subjecting the annealed and planarized copper layer to a flow of nitrogen gas until the annealed and planarized copper layer reaches room temperature; and
applying a dielectric layer over the annealed and planarized copper layer using CVD;
wherein the annealing step exposes the planarized copper layer to a temperature of between about 200° C. and 260° C.; and
wherein the forming gas environment comprising hydrogen is maintained during the annealing step and the step of applying the dielectric layer.

14. The method of claim 13, wherein the step of planarizing the deposited copper layer is performed using chemical mechanical polishing CMP techniques.

15. The method of claim 14, wherein the step of annealing the planarized copper layer is performed at an annealing temperature of about 200° C., and the annealing temperature is held substantially constant for at least about 180 seconds.

16. The method of claim 13, wherein the step of annealing the planarized copper layer is performed at a temperature of between about 220° C. and 260° C.

17. The method of claim 16, wherein the step of annealing the planarized copper layer further comprises holding the annealing temperature substantially constant for a duration of about 150 seconds to about 200 seconds.

18. The method of claim 16, wherein the step of annealing the planarized copper layer further comprises holding the annealing temperature substantially constant for a duration of about 180 seconds.

19. The method of claim 13, wherein the forming gas environment comprising hydrogen comprises a quantity of hydrogen gas sufficient to substantially reduce copper oxides on a surface of the planarized copper layer.

20. The method of claim 19, wherein the hydrogen gas is diluted with nitrogen gas such that the forming gas environment comprising hydrogen comprises approximately 5% by volume of hydrogen and approximately 95% by volume of nitrogen.

* * * * *